US006535398B1

(12) United States Patent
Moresco

(10) Patent No.: US 6,535,398 B1
(45) Date of Patent: Mar. 18, 2003

(54) MULTICHIP MODULE SUBSTRATES WITH BURIED DISCRETE CAPACITORS AND COMPONENTS AND METHODS FOR MAKING

(75) Inventor: Larry L. Moresco, San Carlos, CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/519,713

(22) Filed: Mar. 7, 2000

(51) Int. Cl.$^7$ ................................................. H05K 7/06
(52) U.S. Cl. ....................... 361/792; 361/760; 361/763; 361/782; 361/784; 361/794; 361/795; 257/700; 257/724
(58) Field of Search ................................. 361/734, 738, 361/760, 763, 766–768, 771, 780, 782–784, 803, 792–795, 744; 257/685, 686, 700, 723, 724; 174/256, 258–260

(56) References Cited

U.S. PATENT DOCUMENTS

| 4,322,778 A | * | 3/1982 | Barbour et al. ............. 174/254 |
| 4,574,255 A | * | 3/1986 | Fujii et al. .................... 331/25 |
| 4,755,910 A | | 7/1988 | Val ............................. 361/763 |
| 4,811,082 A | * | 3/1989 | Jacobs et al. ............... 174/261 |
| 4,901,136 A | | 2/1990 | Neugebauer et al. ....... 257/691 |
| 5,014,114 A | | 5/1991 | Heckaman et al. ......... 257/707 |
| 5,032,896 A | | 7/1991 | Little et al. ................. 257/686 |
| 5,075,253 A | * | 12/1991 | Sliwa, Jr. .................... 257/723 |
| 5,077,639 A | | 12/1991 | Haller et al. ................ 361/782 |
| 5,095,402 A | | 3/1992 | Hernandez et al. ...... 361/306.2 |
| 5,177,670 A | | 1/1993 | Shinohara et al. .......... 361/738 |
| 5,237,204 A | | 8/1993 | Val ............................. 257/698 |
| 5,239,198 A | | 8/1993 | Lin et al. .................... 257/693 |
| 5,239,448 A | | 8/1993 | Perkins et al. .............. 361/764 |
| 5,255,431 A | | 10/1993 | Burdick ........................ 29/840 |
| 5,384,691 A | * | 1/1995 | Neugebauer et al. ....... 361/794 |
| 5,473,513 A | * | 12/1995 | Quinn ......................... 361/760 |
| 6,018,463 A | * | 1/2000 | Winslow et al. ............ 257/700 |
| 6,147,876 A | * | 11/2000 | Yamaguchi et al. ........ 257/698 |
| 6,153,290 A | * | 11/2000 | Sunahara .................... 428/210 |

* cited by examiner

Primary Examiner—Albert W. Paladini
Assistant Examiner—John B. Vigushin
(74) Attorney, Agent, or Firm—Coudert Brothers LLP

(57) ABSTRACT

Modularly constructed multichip modules with are disclosed. A plurality of miniature capacitor substrates and/or miniature resistor substrates are assembled and attached to a base substrate, preferably in a regular pattern. Power supply substrates are preferably attached to the base substrate along with the miniature substrates. All of the attached components are preferably pretested and have thicknesses close to one another. The pretesting substantially increases the manufacturing yield. Gaps between the miniature substrates and power supply substrates are filled with a polymer material, such as a powder-filled polyimide precursor. Thereafter, dielectric layer is formed over the components to provide a more planar surface. The dielectric layer is preferably planarized, such as by a chemical mechanical polishing process, to provide for a more planar layer. Thereafter, a plurality of interleaving metal and dielectric layers are formed over the assembled components to provide power distribution planes and signal lines.

22 Claims, 5 Drawing Sheets

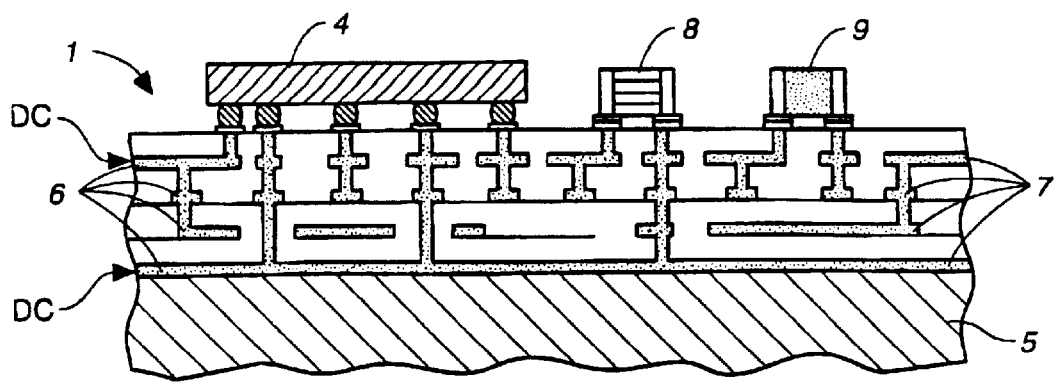
FIG._1 (PRIOR ART)
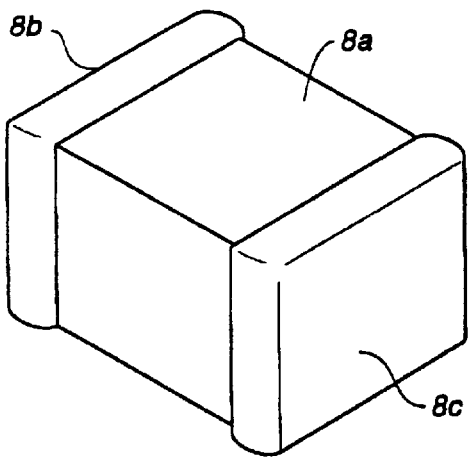
FIG._2 (PRIOR ART)
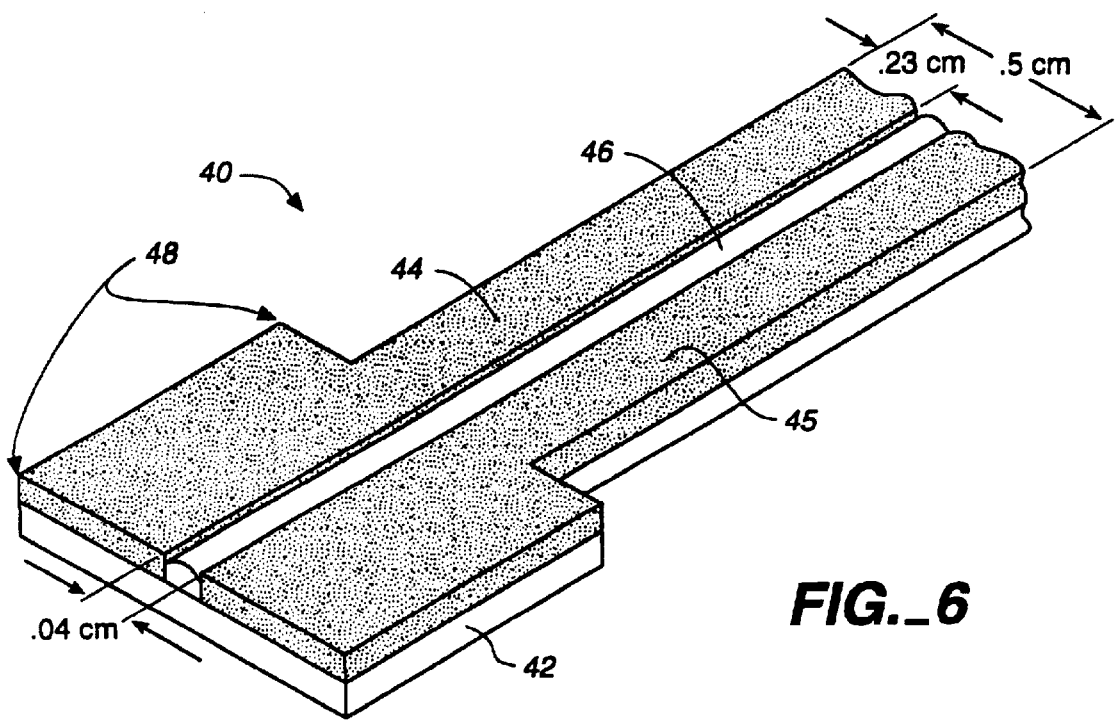
FIG._6

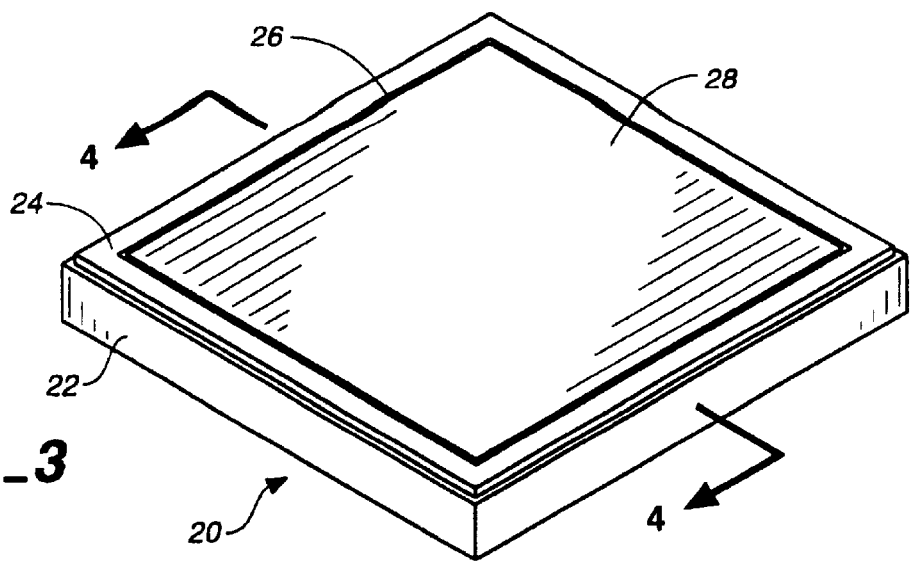
FIG._3
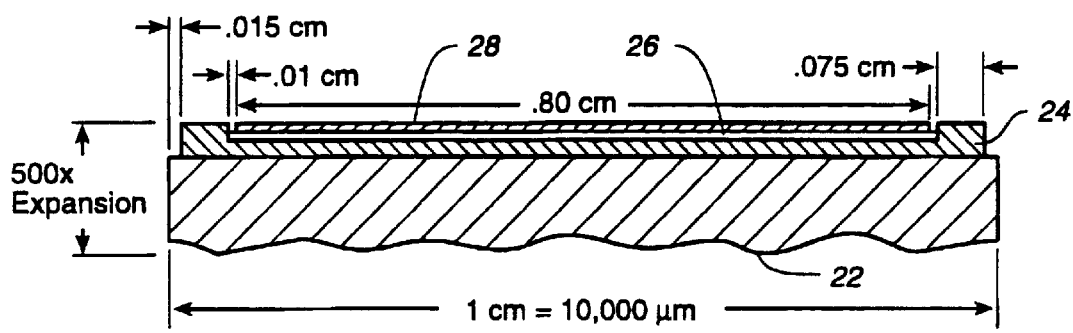
FIG._4
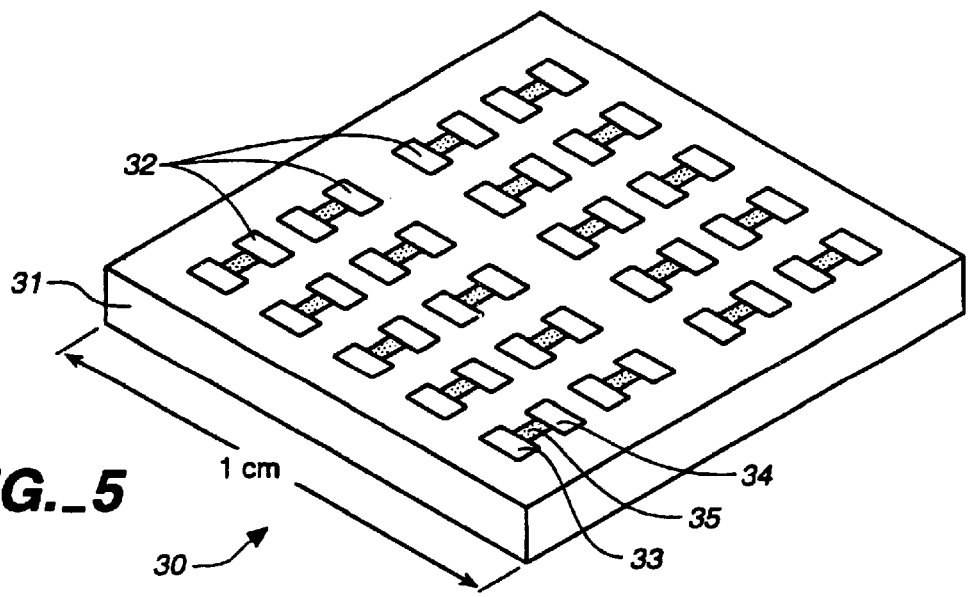
FIG._5

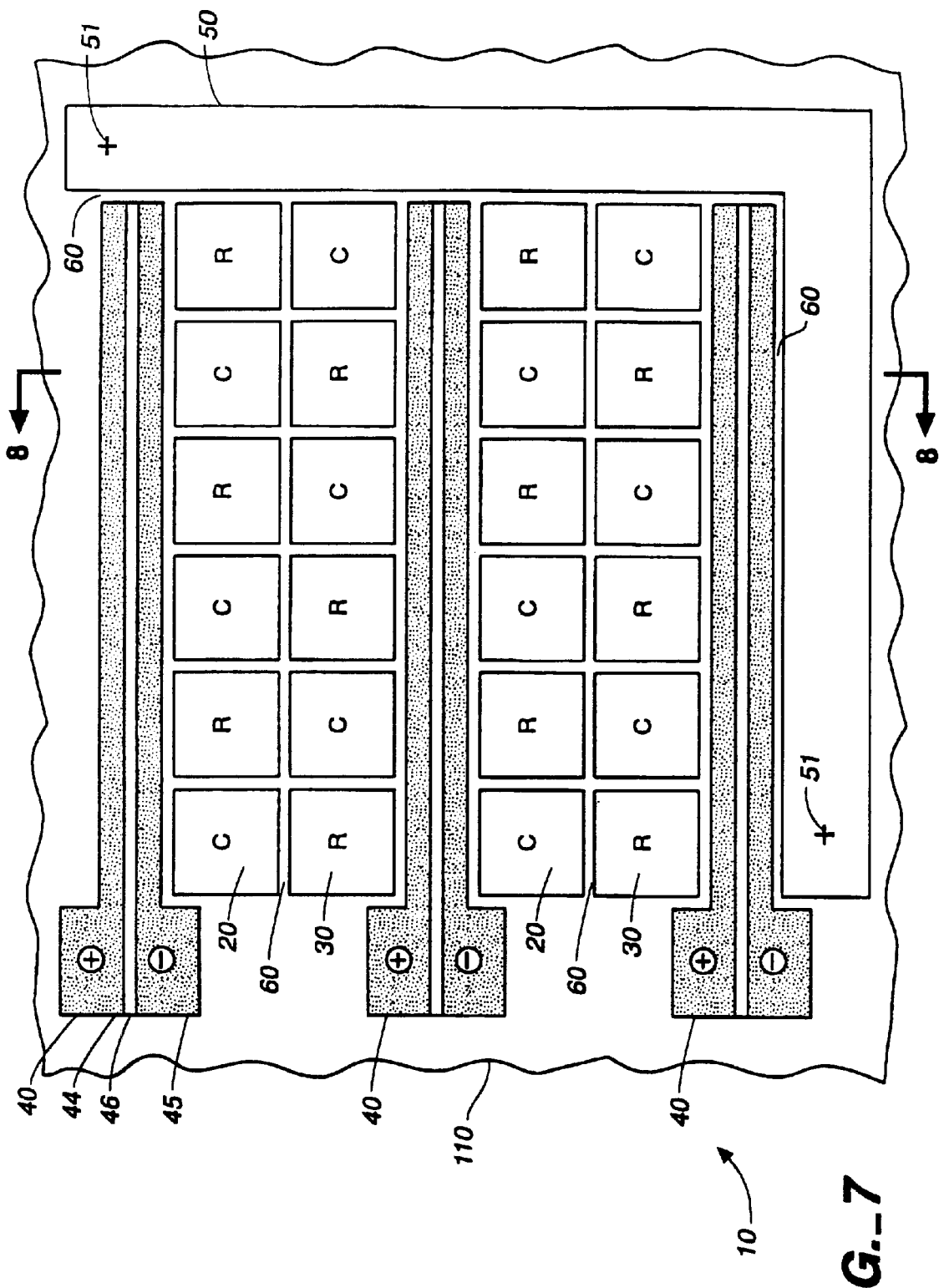
FIG._7

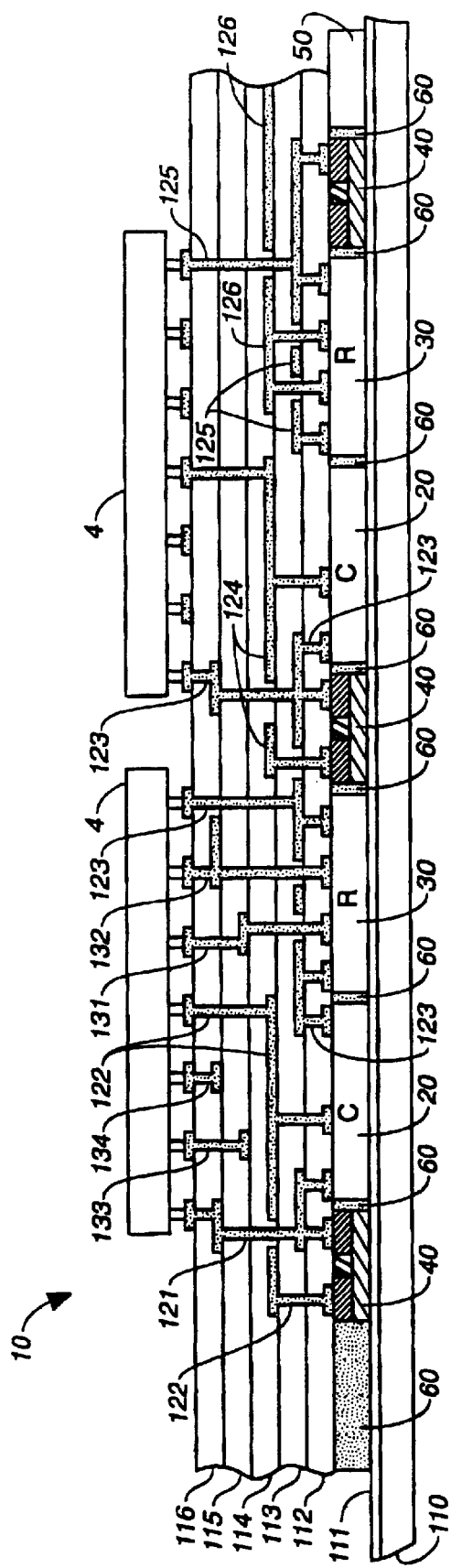
FIG._8

MULTICHIP MODULE SUBSTRATES WITH BURIED DISCRETE CAPACITORS AND COMPONENTS AND METHODS FOR MAKING

FIELD OF THE INVENTION

The present invention relates to electrical interconnect substrates and the like for integrated-circuit (IC) based electronic systems and the like. More specifically, the present invention relates to integrating discrete components such as resistors and capacitors with the interconnect substrates which are used to interconnect the electrical signals between IC chips.

BACKGROUND OF THE INVENTION

In present day multichip modules (MCMs), the conventional technique for including the required amount of power supply bypass capacitance and signal-line termination resistors is by soldering discrete capacitor and resistor components on the surface of the multichip modules. An example of a typical multichip module is shown at 1 in FIG. 1. The module comprises a base substrate 5 upon which a plurality of interleaving metal layers 6 and dielectric layers 7 are formed. The top metal layer comprises a plurality of pads for making contact to integrated circuit (IC) chips 4, discrete bypass capacitors 8, and discrete termination resistors 9. The first metal layer 6 above substrate 5 and the fourth metal layer 6 above substrate 5 are the power and ground distribution planes, and are designated by the symbol "DC" in FIG. 1. The distribution planes are electrically coupled to the integrated circuit chips 4 by way of vias formed through dielectric layers 7. The second and third metal layers above substrate 5 generally carry signal lines between the integrated circuit chips 4 attached to the module.

The discrete capacitors 8 have their first terminals coupled to one distribution plane and their second terminals coupled to the other distribution plane, as shown in FIG. 1. The discrete resistors 7 have their first terminals coupled to a signal line and their second terminals coupled to one of the distribution planes. The purpose of the resistors is to provide a termination path to a stable voltage supply line. The selection of which distribution plane to use, either power or ground, largely depends upon the particular circuit design being implemented by multichip module 1.

A typical discrete capacitor 8 is shown in FIG. 2. It comprises a body 8A which is terminated at either end by solder coated terminals 8B and 8C. During assembly, capacitor 8 is placed upon corresponding pads of the module 1 and is soldered thereon, such as by a solder reflow process. In order to achieve a reasonable and useful level of capacitance for its intended purpose of bypassing transient current and voltage pulses on the distribution planes, capacitor 8 is rather large and bulky. Resistors 9 have similar structure and shape as capacitors 8. Referring back to FIG. 1, the discrete components 8 and 9 take up a substantial amount of surface area for the module 1, which limits the number of integrated circuits that can be mounted on the multichip module.

There are a number of disadvantages to the structure shown in FIG. 1. First, as noted above, there is an inefficient use of board space for integrated circuit (IC) chips 4 because the discrete components take up a significant amount of surface area. Second, there is a large inductance path between the bypass capacitors 8 and the power inputs to the IC chips 4. This inductance occurs in the relatively long routing path for the bypass power provided by the capacitor, which must travel from the capacitor through the vias down to the distribution planes, over the planes, and back up through the dielectric layers to the IC chips 4. A number of prior art modules have addressed this problem by forming a large area capacitor with additional metal and dielectric layers within the structure. The additional metal and dielectric layers are usually placed at the bottom next to substrate 5, and use a very thin dielectric between two metal layers. Although this structure can provide bypass capacitance with lower inductance, these capacitors have very low yield because they cover substantially the entire area of the substrate and are potentially affected by each defect on the substrate. (As a general rule, forming any structure over a large area substantially increases the risk of defects being formed during the formation of the structure.)

As an additional drawback of the structure shown in FIG. 1, the interconnect vias needed to connect a discrete resistor between a signal line and a distribution plane add parasitic capacitance and inductance to the resistor, which impedes the ability of the resistor to provide a controlled-impedance termination. Moreover, the internal structure of the resistor itself, because of its large size, introduces additional parasitic capacitances and inductances. These parasitic components severely impede the discrete resistor's ability to act as good high-frequency signal terminator, thereby limiting the overall signal transmission performance of the module.

Accordingly, there are several drawbacks with present day multichip modules which hinder their ability to achieve high levels of density and speed. The present invention is directed toward addressing these drawbacks.

SUMMARY OF THE INVENTION

The present invention addresses these drawbacks by providing a modularly constructed multichip module. Starting with a base substrate, a plurality of miniature capacitor substrates and/or miniature resistor substrates are assembled and attached to the base substrate, preferably in a regular array pattern. Power supply substrates ("power bars") are preferably attached to the base substrate along with the miniature substrates. All of the components so attached are preferably pretested and have thicknesses which are close to one another. The pretesting substantially increases the manufacturing yield of the module. The gaps between the miniature substrates and power supply substrates are filled with a polymer material, such as a powder-filled polyimide precursor. Thereafter, a dielectric layer is formed over the components to provide a more planar surface. The dielectric layer is preferably planarized, such as by a chemical mechanical polishing process, to provide for a more planar layer. Thereafter, a plurality of interleaving metal and dielectric layers are formed over the assembled components to provide power distribution planes and signal lines. Miniature capacitor substrates are preferably positioned underneath respective integrated circuit chips to provide very short paths and very small inductance to the integrated circuit chips. In a similar manner, the miniature resistor substrates are placed close to the desired point of signal termination, which is typically at the interconnect pad of an IC chip. As an important feature, the miniature substrates enable the resistors to be implemented in a technology which provides significantly less parasitic capacitance and inductance. As another important feature, because the capacitors and resistors are below the integrated circuit chips, they do not occupy valuable surface area of the module. This arrangement enables a much higher density of integrated circuit chips to be formed over the surface of the multichip module.

As an additional feature and advantage of the present invention, some of the resistor elements may be configured in selected embodiments of the present invention to selectively heat the interconnect pads under a selected IC chip to melt the solder bonds and enable easy removal of the IC chip. During operation of the module, one or more of the IC chips may occasionally fail and require replacement. This feature of the present invention enables easy replacement of failed chips.

Accordingly, it is an object of the present invention to provide a high value capacitance in close proximity to an integrated circuit chip in a multichip module with a minimal amount of supply line inductance.

It is yet another object of the present invention to reduce the amount of parasitic capacitance and inductance associated with the signal termination resistors in multichip modules.

It is still a further object of the present invention to enable the manufacture of multichip modules with high bypass capacitance without degrading manufacturing yields.

It is yet a further object of the present invention to increase the density of integrated circuit chips for multichip modules.

These and other objects of the present invention will become apparent to those skilled in the art from the following detailed description of the invention, the accompanying drawings, and the appended claims.

BRIEF DESCRIPTION OF THE DRAWINGS

FIG. 1 is a partial cross-sectional view of an interconnect substrate according to the prior at where capacitor and resistor components are mounted on the surface of the interconnect substrate.

FIG. 2 is a perspective view of a surface mount device according to the prior art.

FIG. 3 is a perspective view of a miniature capacitor substrate according to the present invention.

FIG. 4 is a partial cross-sectional view of substrate capacitor shown in FIG. 3 according present invention with the vertical dimension expanded for clarity.

FIG. 5 is a perspective view of a substrate miniature resistor according to the present invention having a plurality of resistors formed thereon.

FIG. 6 is a perspective view of a power supply structure according to the present invention.

FIG. 7 is a partial top plan view of exemplary components according to the present invention attached to a base substrate according to the present invention.

FIG. 8 is a partial cross-sectional view of an exemplary modularly constructed multichip module according to the present invention with the vertical dimension expanded for clarity.

DETAILED DESCRIPTION OF THE INVENTION

Figure 9:
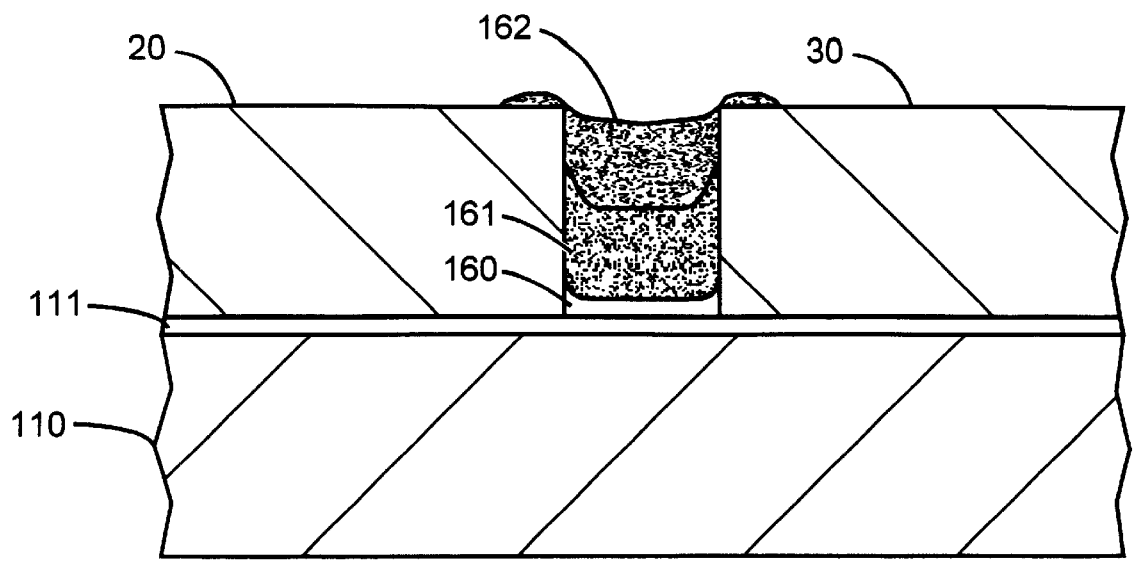
FIG. 9 is a cross-sectional view of a gap filled according to the present invention.

FIG. 7 shows a top plan view of an exemplary multichip module 10 during the initial stages of construction, and FIG. 8 shows a cross-sectional view thereof after construction where it has been used to interconnect a plurality of integrated-circuit chips 4. Referring to FIG. 7, a plurality of miniature capacitor substrates 20 and miniature resistor substrates 30 are attached to a base substrate 110 with a high temperature adhesive 111 (shown in FIG. 8). Adhesive 111 preferably comprises a polyimide precursor, which can withstand temperatures of over 500° C. when cured. Each capacitor substrate 20 has one or more individual capacitors formed thereon, and each resistor substrate 30 has a plurality of individual resistors formed thereon. The miniature substrates 20 and 30 are pre-tested. These preferably have approximately the same dimensions and are preferably arranged in a regular pattern. In the exemplary embodiment shown in FIGS. 7 and 8, the miniature capacitor substrates 20 and resistor substrates 30 are arranged in parallel rows in alternating order along each row, with each row starting with a different component type (so-call "red-black" ordering). Power supply substrates (power bars) 40 are preferably attached to base substrate 110 with adhesive 111 along with the miniature substrates. Substrates 20, 30, and 40 preferably have thicknesses which are within approximately 50 $\mu$m of one another. While the substrates are preferably positioned by assembly equipment, they may be positioned by hand with conventional vacuum handling wands when building small-scale modules where the terminals on the resistor and capacitor substrates are large (terminals on the order of 2 square millimeters or more). For aligning the substrate by hand, an angled, or L-shaped, substrate 50 may be used to provide vertical and horizontal alignment axes, as shown in FIG. 7, as well as alignment marks 51 for subsequent processing steps. Substrates 50 are attached by adhesive 111 and have approximately the same thickness as substrates 20–40. If alignment substrate 50 is not used, alignment marks 51 are placed on appropriate ones of substrates 20–40, or all of substrates 20–40.

The substrates 20–50 are preferably placed such that a plurality of gaps 60 are formed around the substrates. The gaps 60 facilitate the removal of air bubbles and gas during the attachment of the substrates 20–50, and enable excess adhesive 111 at the back surface of the substrates to escape, if necessary. The widths of the gaps 60 are typically between 0.25 mm and 2 mm. As described in greater detail below, gaps 60 are filled with a polymer filler material, such as a powder-filled polyimide precursor, after the substrates 20–50 are attached.

Referring to FIG. 8, a dielectric layer 112 is formed over the substrates 20–50 and gaps 60, and is thereafter polished to provide a more planar surface upon which metal lines, connection pads, and interleaving dielectric layers will be built. The metal lines provide interconnects between the chips 4, connections from chip outputs to the termination resistors on substrates 30, interconnections for power distribution to the chips 4 from the bypass capacitors 20 and the power supply substrates 40. The dielectric layers are indicated by reference numbers 112–116 and electrically isolate different levels of metal lines from one another. For visual clarity, the vertical dimension of the stack of metal lines, pads and dielectric layers 112–116 has been expanded by approximately a factor of ten (10). Chips 4 are mounted face down in the connection pads so that their top surfaces face the top surfaces of capacitor and resistor substrates.

Capacitor substrates 20 are preferably positioned underneath respective integrated circuit chips 4 to provide very short paths and very small inductances to the chips 4. Likewise, resistor substrates 30 are placed close to the desired point of signal termination, which is typically at an interconnect pad of an IC chip. Substrates 30 enable the termination resistors to be implemented on a substrate with a low dielectric constant, which reduces parasitic capacitance, and enables the resistors to be more closely positioned to the interconnect pads of the chips, which significantly reduces inductance. As another important feature, because the capacitors and resistors are below the integrated circuit chips 4, they do not occupy valuable surface area of the module. This arrangement enables a much higher density of integrated circuit chips 4 to be formed over the surface of the multichip module.

We next describe the construction of exemplary substrates 20–50. After this discussion, we describe the metal lines which interconnect these substrates to one another and to chips 4.

Capacitor Substrates

FIG. 3 shows a perspective view of a miniature capacitor substrate 20 which will be used in the construction of the multichip module according to the present invention. Capacitor substrate 20 comprises a base substrate 22, upon which a first electrode layer 24 is formed. Upon layer 24 is formed a dielectric layer 26, which preferably comprises a high dielectric material. Such dielectric material may be formed by anodization or by a sputter-anodization process, which is well known to the art. Upon dielectric layer 26 is formed a second metal layer 28. Electrical connection to the capacitor structure formed on substrate 20 may be made by way of the exposed portions of layers 24 and 28, which are the terminals of the capacitor. For clarity, the vertical dimension of substrate 22 has been expanded by a factor of approximately 2.

In preferred embodiments of the present invention, capacitor structures which can withstand exposures to high temperatures (300° C.–400° C. and above) are employed since the methods for constructing the multichip modules according to the present invention generally employ high temperature processing steps, such as for curing polymer dielectric layers. (The construction methods are more fully described below.) Suitable high-temperature capacitor structures are described by U.S. Pat. No. 5,872,696 to Peters, et al., "Sputtered and Anodized Capacitors Capable of Withstanding Exposure to High Temperatures," which is assigned to the assignee of the present application. As a brief summary, exemplary capacitor structures from these references employ a bottom aluminum electrode which is covered with a conductive layer of tantalum nitride (TaN), which acts as a high temperature diffusion barrier to aluminum. A layer of elemental tantalum is formed over the tantalum nitride layer, which in turn is covered by a sputtered layer of tantalum pentoxide ($Ta_2O_5$). Both the elemental tantalum and tantalum pentoxide layers are completely anodized, and a small portion of the tantalum nitride layer is anodized to tantalum oxy-nitride. A layer of molybdenum or tungsten is formed over the anodized dielectric layer; these metals do not chemically reduce or diffuse into the tantalum pentoxide at high temperatures. Copper may be formed over the tungsten for better conductivity. After being exposed to several hours at temperatures of 350° C. and above, these capacitor structures have been found to have less than 0.02 defects per square centimeter, and to have leakage currents of less than 0.11 $\mu$A per square centimeter.

Capacitor substrates 20 may be square or rectangular. Preferably, they are square, and may range in size from 0.5 sq. centimeter to 25 sq. centimeters. Moreover, for accurate assembly, substrates 20 are milled or sawed to have uniform and predictable dimensions. Milling and sawing steps for this purpose are well known to the art. The substrates may have an overall thickness of between 125 $\mu$m to 1,000 $\mu$m, with 500 $\mu$m to 625 $\mu$m being typical. A gap of about 200 $\mu$m is preferably left between metal layers 24 and 28 for good electrical isolation. The width of the exposed portion of metal layer 24 is preferably 250 $\mu$m or more. A distance of approximately 150 $\mu$m may be left between the edge of the substrate and the edge of metal layer 24. To reduce manufacturing costs, a plurality of substrates 20 are formed on a larger substrate and then separated from one another by dicing or sawing.

A cross-sectional view of capacitor structure 3 is shown in FIG. 4, where the vertical dimension has been expanded relative to the horizontal dimension by a factor of approximately 500 in order to better show layers 24, 26, and 28. In one exemplary embodiment, bottom layer 24 comprises- a base layer of aluminum (Al) at a thickness of between 2–4 $\mu$m, and a top layer of tantalum nitride (TaN) at a thickness of approximately 5,000 Å (angstroms). Dielectric layer 26 comprises tantalum pentoxide ($Ta_2O_5$) at a thickness of approximately 2,000 Å (angstroms). The oxide layer is formed by anodizing an elemental tantalum layer (600 Å) and a sputtered tantalum pentoxide layer (600 Å), as described above. Sputtering and anodization processes are discussed extensively in technical literature and are well known to those of ordinary skill in the art. No special sputtering or anodization techniques are required to practice the present invention.

Top layer 28 comprises a first layer of tungsten (W) at a thickness of approximately 400 A, a second layer of copper (Cu) at a thickness of approximately 2–4 $\mu$m, and a third layer of chromium (Cr) at a thickness of approximately 200 A. The bottom tungsten layer prevents copper from reacting with the tantalum pentoxide, and the top chromium layer provides good adhesion to polymeric layers, such as polyimide. The exposed portions of bottom layer 24 (at the edges of the substrate) are covered by the material layers used to form top layer 28. As is known in the art, undesirable reactions occur when aluminum contacts copper. In this case, the layers tantalum nitride and tungsten separate these materials to prevent these undesirable reactions.

The back surface of capacitor substrate 20 is preferably coated with an adhesion layer, such as a 200 Å layer of chromium, in preparation for the subsequent step of adhering substrate 20 to base substrate 110.

Resistor Substrates

FIG. 5 shows a perspective view of a miniature resistor substrate 30 according to the present invention having a plurality of resistors 32 formed thereon. The resistor substrate 30 may have the same general dimensions as substrate capacitors 20. Preferably, substrates 20 and 30 have substantially the same dimensions for a particular multichip module implementation. Resistors 32 are preferably disposed on substrate 30 in a regular pattern. Each resistor 32 has a first terminal end 33 and a second terminal end 34 with a section of resistive material 35 between the terminals 33 and 34.

As the methods for constructing multichip modules according to the present invention generally employ high temperature processing steps, resistive materials which can withstand exposures to high temperatures (300° C. to 400° C. and above) are preferably used to construct resistors 32. There are a number of commercially-available and commonly-used resistive materials which may be used for this purpose, such as tantalum nitride (TaN), chromium-silicon-oxide (Cr—SiO), and nichrome (Ni—Cr). Each of these materials has been employed to construct high-temperature resistors, and methods for the construction of high-temperature resistors are well known to the prior art. Oftentimes, a passivation layer is formed over the resistor structure to prevent the resistive material from oxidizing at high temperatures. For example, tantalum pentoxide is often formed over tantalum nitride resistors, and silicon oxide is often formed over chromium-silicon-oxide resistors. Tantalum nitride resistors which can withstand temperatures up to 350° C. can be easily manufactured; tantalum nitride resistors which can withstand temperatures up to 425° C. can be manufactured, but require more careful design and more careful control of processing conditions, particularly annealing conditions. Nichrome resistors which can withstand temperatures up to 350° C. to 400° C. can be readily manufactured, but can be readily etched by contaminants in the passivation layer. For this reason, passivation layer materials for over-coating nichrome resistors must be carefully evaluated. Chromium-silicon-oxide resistors (20% atomic weight SiO) which can withstand temperatures up to 450° C. to 500° C. can be easily manufactured, and are easily protected by silicon dioxide passivation layers. Because of their greater temperature range, chromium-silicon oxide resistors enable greater flexibility in choosing the dielectric polymer materials and curing temperatures used in the exemplary construction methods described below, and are preferred.

Terminals 33 and 34 of resistors 32 may comprise any material which is compatible with the resistive material 35. Nickel, chromium, and titanium may be used. Copper generally does not provide a reliable contact with the above-noted resistive materials, but does form a reliable contact with nickel, chromium, and titanium. Accordingly, terminals 33 and 34 may comprise a bottom layer of nickel, chromium, or titanium, and a top layer of copper. Methods for constructing nichrome, tantalum nitride, and chromium-silicon-oxide resistors which can withstand high temperatures may be found in Maissel, et al., *Handbook of Thin Film Technology*, McGraw-Hill Publishing Company, New York, 1970, (Chapter 18), and Licari, et al., *Hybrid Microcircuit Technology Handbook*, Noyes Publications, Park Ridge, N.J., USA, 1988 (Chapters 3 and 5). Resistors 32 may be fabricated with any of the other well known resistor manufacturing techniques, so long as the resistors can later be exposed to high temperatures in the range of 300° C. and 450° C. without failing, and preferably without having substantial changes in their resistance values. However, if a particular resistor construction process produces resistors which drift in value during subsequent high temperature processing, such a process may still be used as long as the amount of drift can be predicted and compensated for.

Resistors 32 usually have a resistance in the range of approximately 50 ohms to 200 ohms. These values require relatively little space to construct, and therefore, several resistors per square centimeter can be formed, in contrast to the discrete resistors of the prior art shown in FIG. 1. Anywhere from 100 to 1,500 resistors per square centimeter may be formed, with 500 to 800 resistors per square centimeter being typical. For visual clarity, only 20 are shown in FIG. 5. Care must be taken to ensure that the number of active resistors does not generate more heat than can be dissipated by the base substrate, and any cooling means attached thereto. In a 5 V supply system ($V_{CC}$=5 V) with MOS or CMOS circuits, each 50-ohm resistor dissipates 0.22 watts, on average, assuming each signal spends half of its time in each logic state (0 V and ~5 V), on average. (Here, it is assumed that the actual voltage of the high state is ~4.7 V due to an approximate 0.3 V voltage drop in the I.C. output stage which is driving the signal line connected to the resistor.) Around 110 active resistors would dissipate 25 watts, on average. In a 3.3 V system, each 50-ohm resistor dissipates an average of 0.090 watts, and 275 active resistors would dissipate an average of 25 watts. (Here, it is assumed that the actual voltage of the high state is ~3.0 V due to an approximate 0.3 V voltage drop in the I.C. output stage which is driving the signal line connected to the resistor.) The power dissipation can be reduced by designing the system around a higher characteristic impedance, such at 100 ohms, in which case the above power dissipations would be cut in half. The power dissipation may also be cut by connecting one terminal of each resistor to an intermediate supply voltage ($V_{INT}$) which is equal to one-half of the supply voltage ($V_{INT}=\frac{1}{2}V_{CC}$). In a 5 V system ($V_{CC}$=5 V) with the intermediate supply at 2.5 V, each 50-ohm resistor dissipates approximately 0.097 watts, and 260 active resistors would dissipate ~25 watts. In a 3.3 V system, each 50-ohm resistor dissipates approximately 0.036 watts, and 685 active resistors would dissipate ~25 watts.

The back surface of resistor substrate 30 is preferably coated with an adhesion layer, such as a 200 Å layer of chromium, in preparation for the subsequent step of adhering substrate 30 to base substrate 110.

Preparation of Resistor and Capacitor Substrates for the Module Assembly Phase

In the module-assembly phase described in greater detail below, the resistor and capacitor substrates will be attached to a common substrate, and interconnection signal lines will be formed over the resulting composite substrate. Because the substrates will likely be at different heights, the assembly process anticipates that there may be step changes in profile height of up to approximately 50 µm between adjacent substrates, and therefore the assembly process preferably planarizes the composite substrate so that the step changes in height are reduced to less than approximately 5 µm. The planarization process is preferably accomplished with mechanical polishing or chemical-mechanical polishing (CMP). In order to accomplish this planarization step without destroying the resistor and capacitor structures, a 50 µm buffer layer of polyimide is formed over the resistor and capacitor substrates. The buffer layer may include vias to the resistor and capacitor terminals, and may also include one or more polish-stop layers to guard against "dishing" effects in the polishing process.

The buffer layer may comprise a thin polyimide layer (e.g., 1–10 µm thick), a thin polish-stop layer (e.g., a tungsten layer less than 1 µm) over the thin polyimide layer, and a thick polyimide layer (e.g., 40–50 µm thick) over the polish-stop layer. These layers are formed on the miniature substrates while they are still part of a common substrate (i.e., before the substrates are separated from one another). After the substrates have been attached to the module's base substrate and after performing the polishing step, laser drilling may be used to form via contacts through the buffer layer to the resistor and capacitor terminals. When using a metallic polish-stop, large windows may be removed in the polish-stop layer in those areas where the terminals are to be contacted. The removal facilitates the drilling and via formation, and prevents unwanted electrical connections. As another approach, the metal polish-stop layer may be selectively etched (i.e., patterned) before the thick polyimide layer is formed such that the polish-stop layer is segmented into many small, closely-spaced rectangles (or other polygon shapes). The rectangles of the polish-stop material are electrically isolated from one another, so that when several vias are formed through the polish-stop layer the vias are electrically isolated from one another even though each via may make electrical contact to one or more rectangles.

For modules where there are to be a large number of vias to each capacitor and resistor substrate, the via contacts may be formed in the buffer layer with standard photo-lithographic techniques. As one example, the via construction methods described in U.S. patent application Ser. No. 08/717,266, to Beilin, et al., now U.S. Pat. No. 5,916,453, entitled "Methods of Planarizing Structures on Wafers and Substrates by Polishing," which is assigned to the assignee of the present application, may be used. In one of these exemplary methods, a thin electroplating seed layer is uniformly formed over the miniature substrates (preferably before they are separated from one another), and a thick layer of photoresist material (20 µm to 50 µm) is formed over the seed layer. The photoresist layer is exposed to patterned actinic radiation, and developed to form via apertures down to the terminal locations (and the seed layer) of the resistors and capacitors, the vias having diameters of at least 10 µm, with 25 µm to 250 µm being typical. The apertures are then filled with copper by an electroplating process, and the photoresist is then removed to reveal copper posts. The seed layer is etched away, and a thick layer of polyimide (15 µm to 45 µm) is formed over the substrate and the posts such that the polyimide layer has high spots over the posts and low spots in the areas between the posts. The low spots are at a substantially uniform level below the tops of the posts. The polyimide is cured and then polished to planarize the posts to the level of the low spots in the polyimide layer. An etch stop layer is preferably deposited on the low spots to facilitate the polishing process. The above sequence of steps may then be repeated to provide the desired height of the buffer layer. This buffer layer may be built upon an etch stop layer and thin polyimide layer, as previously described.

Power Supply Substrates

FIG. 6 is a perspective view of an exemplary power supply substrate 40 according to the present invention. Power supply substrate 40 comprises an elongated rectangular substrate 42 upon which two or more thick metal lines 44 and 45 are formed. A dielectric spacer 46 is preferably formed between the two metal lines to ensure planarity of the structure and to ensure electrical isolation between the metal lines. Each metal line carries a potential, which may be ground or a supply-line voltage.

In an exemplary embodiment, substrate 42 is approximately the same thickness as the base substrates for the resistor and capacitor structures (125 µm to 1,000 µm, with 500 µm to 625 µm being typical), and metal lines 44 and 45 have a thickness of between 15 µm to 35 µm, with 25 µm being typical. The width of power supply substrate 40 may be equal to the width of a resistor/capacitor substrate, or may be equal to one-half the width of a resistor/capacitor substrate, which is shown in FIG. 6. One end of the power supply substrate may have a larger width, as shown in FIG. 6, to permit large-scale connection points for providing electrical power.

The exemplary power supply substrate may be constructed by the following exemplary method. A number of power supply substrates 40 are constructed on a common silicon wafer. A 200 Å thick layer of chromium is sputtered over a silicon wafer to provide adhesion for a 25 µm thick layer of copper. The copper layer is formed by sputtering a 2 µm thick layer of copper, and then electroplating 28 µm thick layer of copper to form metal lines 44 and 45. Before performing the electroplating operation, however, a 30–40 µm thick photoresist layer is formed over the substrate and then photo-lithographically defined to leave strips of photoresist in those locations where dielectric spacer 46 is to be formed. The photoresist strips will prevent copper from being plated at these locations. After plating, the photoresist layer is removed, which leaves a 2 µm thick layer of copper in those locations where dielectric spacer 46 is to be formed. The structure is then subjected to a copper etchant solution to remove this 2 µm thick layer of copper. The copper etchant also removes copper from lines 44 and 45, reducing the thickness from 28 µm to approximately 25 µm. A chromium etchant is then used to remove the bottom chromium layer. Dielectric spacer 46 is then formed by coating the wafer with a layer of a polyimide precursor (sometimes generically referred to as polyamic acid), which is then cured and planarized with a mechanical polishing step or a chemical-mechanical polishing step. Two layers of polyimide processed in this manner may be needed to fill the gap where spacer 46 is located, depending upon the physical properties of the polyimide being used.

In preferred embodiments, relatively thin tungsten layers are formed over the top surface of metal lines 44 and 45, and are used as polish-stop layers for later polishing steps in the module assembly phase (to be described below). The tungsten layer may be formed by sputtering or evaporating a layer of tungsten over lines 44, 45 and spacers 46, followed by etching away those portions which overlie spacers 46. The tungsten layer may also be formed before the photoresist strips used for defining spacers 46 are removed. In this case, the tungsten layer is deposited over the photoresist strips and the metal lines 44 and 45. The tops of the photoresist strips, which are.above the metal lines, are removed by a brief polishing step, and the remainder of the photoresist is removed by conventional stripping.

The back surface of power supply substrate 40 is preferably coated with an adhesion layer, such as a 200 Å layer of chromium, in preparation for the subsequent step of adhering substrate 40 to base substrate 110.

Alignment Substrate 50

This may be made from silicon wafers by saw cutting. Prior to cutting, alignment marks 51 may be formed on the surface by any number of materials and steps.

Substrate Selection

Each of the substrates 20–50 may comprise silicon (Si), alumina ($Al_2O_3$), or other suitable materials. To reduce thermal mismatch with chips 4, substrates 20–50 and base substrate 110 preferably have approximately the same coefficient of thermal expansion. For silicon chips 4, substrates 20–50 and 110 may comprise silicon; for gallium-arsenide (GaAs) chips 4, substrates 20–50 and 110 may comprise alumina. Capacitor substrate 20 and power supply substrate 40 could comprise metal substrates. In order to reduce parasitic capacitances associated with the termination resistors 32, resistor substrate 30 is preferably fabricated on top of a dielectric material having a relatively low dielectric constant. Silicon dioxide, which may be readily formed over the surface of a silicon substrate by deposition or oxidation, has a relatively low dielectric constant.

Interconnection of Substrates

Line 121 connects the right power strip of the left power substrate 40 to a pad on the left chip 4, and further to the outer electrode of the left capacitor substrate 20. Line 122 connects the left power strip of the left power substrate 40 to a center pad of the left chip 4, and further to the center electrode of the left capacitor substrate 20. Thus, lines 121 and 122 connect the two strips of the left power substrate 40 to two corresponding terminals of the left capacitor substrate 20, and then connect the these terminals of the capacitor to corresponding pads of the left-most chip 4. Metal lines 123 and 124 perform similar interconnections for the right-most chip 4, using the center power substrate 40 instead of the left power substrate, and using the right-most capacitor substrate 20 instead of the left-most 4 capacitor substrate. Lines 121 and 123 may provide a ground potential power to chips 4, and lines 122 and 124 may provide a power potential to chips 4.

Line 123 is also extended to the left along the top of dielectric layer 112 to provide connections to the left-most chip 4 by a vertical via through dielectric layers 113–116, and to two of the resistors on the left-most resistor substrate 30, and also to the outer electrode of the left-most capacitor substrate 20.

Signal lines 131 and 132 connect respective signal pads of the left-most chip 4 to respective terminals of two resistors on the left-most resistor substrate 30. The other terminals of these two resistors are connected to line 123. Signal lines 131 and 132 are also connected to pads of another chip (they are routed outside of the cross-sectional view of FIG. 8). Signal lines 133 and 134 are routed to other chips 4, where the connections to corresponding termination resistors are made. Signal lines similar to 133–134 are present for the right-most chip of FIG. 8, but are not shown in the cross-section of FIG. 8.

Instead of showing corresponding signal lines 131–132 connected to two resistors of the right-most resistor substrate in FIG. 8, a control line 126 is shown connecting the terminals of two resistors. The other two terminals of these resistors are connected to the ground strip of the right-most power substrate 40 by line 125. These resistors are used to heat the area underneath the right-most chip 4 in order to melt the solder bonds between the chip interconnect pads on the right-most chip 4 and the corresponding interconnect pads on the top surface of module 10. Outside of the cross-sectional view of FIG. 8, control line 126 is coupled to additional resistors on the right-most resistor substrate 30. If the current carrying capacity of layer 126 is limited, the heating resistors may be wired in series, or in a parallel-series combination, and the voltage on line 126 raised in order to reduce the current in line 126 while maintaining the same power dissipation. While the heating resistors are only under one portion of the right-most chip 4, the heat generated by these resistors is conveyed to the other portions of chip 4 through the metal and dielectric lines. Oftentimes, a ground plane will be disposed on one of dielectric layers 112–115 to provide a controlled impedance path for the signal lines. The ground plane can provide a convection surface for carrying the heat to other portions of the chip which are not directly below the heating resistors. In FIG. 8, lines 123 and 125 carry ground potential and can be merged together to form a ground plane.

Module Assembly

FIG. 7 shows a partial top plan view of the substrates 20, 30, and 40 according to the present invention assembled on top of a base substrate 110, to form an exemplary multichip module 10 according to the present invention. As shown in FIG. 7, four rows of alternating capacitor substrates 20 and resistor substrates 30 are shown. Two rows are adjacent to one another and bounded by two power supply substrates 40. The remaining two rows are similarly bounded by power supply substrates. Other arrangements are possible, including arrangements having staggered rows. The assembly of the modules comprises the general steps of: (1) positioning the miniature substrates 20–50 with respect to the base substrate 110, (2) adhering the miniature substrates 20–50 to the base substrate 110, and (3) filling the gaps between miniature substrates 20–50. Methods for each of these general steps are described below. The materials used in the adhesion and gap-filling steps are to withstand the temperatures in subsequent processing steps without decomposing or forming gaseous products. Decomposition products and other gaseous products can cause gas bubbles to form under the dielectric and metal layers which will be formed over miniature substrates 20–50. The volumes of such bubbles change with the temperature, and create an uneven surface during the later processing steps. Polyimide precursor materials are adhesive and, when cured to form polyimide layers, can withstand temperatures of over 500° C. without decomposing. Substrates 20–50 are also to be adhered to base substrate 110 without any air bubbles of significant size formed between the surfaces of the substrates. Such an air bubble can expand during a subsequent high-temperature processing step and cause the miniature substrate above it to rise and potentially damage the metal lines formed above the miniature substrate.

Substrate Positioning Steps

Commercially available surface mounting equipment and flip-chip bonding equipment may be used to position the components, either directly on base substrate 110 or on a transfer shuttle plate that is subsequently mated against base substrate 110. Alignment marks may be included on the substrates and/or the base substrate (or shuttle plate) for this purpose. Surface mount equipment, flip-chip equipment, or a custom purpose aligner can place components to within ±2 $\mu$m to ±5 $\mu$m of the desired position. Such equipment enables resistor and capacitor substrates with small terminals to be readily used in constructing the modular multichip modules according to the present invention.

Although mounting equipment is extremely useful, hand positioning methods may be used for small-scale modules in which the terminals on the resistor and capacitor substrates are large (terminal sizes on the order of 2 square millimeter or more). In this regard, power supply substrates 40 provide for appropriate horizontal alignment of the components along the rows, and an angled, or L-shaped, substrate 50 may be utilized to provide for appropriate vertical alignment, as shown in FIG. 7. Alignment substrate 50 is placed down first, followed by the adjacent power supply substrate 40, and followed by the rows of capacitor and resistor substrates. The substrates are preferably spaced apart from one another with the use of removable spacers which are removed once the substrates are positioned. Conventional vacuum handling wands may by used to handle the substrates.

In another positioning method, the components are first positioned face down on the surface of a shuttle plate. The shuttle plate may have a recess formed for each substrate so that each component may be precisely set into its position by hand. The shuttle plate may also have rows of solder bumps or wire-bond balls formed on its surface to define the locations for the miniature substrates. The shuttle plate may have vacuum ports which hold the miniature substrates firmly in position until the vacuum is released. In this case, the components may be placed down with flip-chip or surface mounting equipment since the vacuum port will firmly hold the miniature substrate once it is placed. Once the miniature substrates are positioned on the shuttle plate, base substrate 110 may be placed face down upon the shuttle plate so that its top surface contacts the back surfaces of the substrates 20, 30, and 40. The shuttle plate and the base substrate 110 are held together and then flipped 180 degrees, to place the base substrate 110 right-side up. The shuttle plate may then be removed. If the shuttle plate has vacuum holding ports, the shuttle plate may instead be placed face down upon base substrate 110. In either case, the mating of the shuttle plate with the base substrate is done in a vacuum environment to minimize the formation of air bubbles. The shuttle plate enables large modules to be constructed with large numbers of miniature substrates 20–50 positioned with a high degree of precision, and without necessarily needing flip-chip or surface mount equipment.

Adhesion Steps

The substrates 20–50 may be bonded to base substrate 110 using a number of methods. One method employs a self-priming, fluidized polyimide precursor, which is coated as a layer 111 (FIG. 8) on base substrate 110 to a thickness which achieves a cured thickness of around 20 μm, and then partially soft-baked to a partially tacky state. (If a self-priming precursor is not used, an adhesion promoting layer may be formed beforehand.) The miniature substrates are then positioned on top of the soft-baked precursor layer 111, such as by any of the above-described positioning methods. The placement method which uses the transfer shuttle and mates the components under a vacuum environment is preferred with this adhesion method. The partial soft-baking of layer 111 ensures a more uniform height placement of the miniature substrates 20–50, reduces the amount of solvent which needs to be removed from the adhesion layer 111 and reduces the amount of any trapped air underneath the miniature substrates (if the components are not mated under a substantial vacuum). Once the miniature substrates have been placed upon layer 111, they are pressed into layer 111, preferably under a vacuum environment, to ensure contact with layer 111. A cushion pad mounted on a flat plate may be used for this step; soft polishing pads used in chemical-mechanical polishing processes may be used for the cushion pad. The cushion pad accommodates for any differences in heights of the miniature substrates and for any unevenness in base substrate 110, and ensures that each miniature substrate is pressed into layer 111.

When shuttle-plate positioning methods are used, the soft-baking of the adhesion layer may be omitted and base substrate 110 may be immediately mated with the substrates 20–50 after the fluidized precursor layer 111 is formed on base substrate 110. This is preferably done under a substantial vacuum environment. This allows contact with the substrates 20–50 while the polyimide precursor is in a fluidized state, where it forms more points of contact than it does when it is in its tacky state.

Next, the assembly is heated gradually in stages to remove the remaining solvent in the fluidized polyimide precursor layer 111, and to then cure the polyimide precursor material. The curing step typically generates water vapor. The times and temperatures of the heating stages are provided by the adhesive manufacturer's. The times of the heating stages are extended over those provided by the manufacturer to account for the diffusion time of the solvents and water vapor from underneath the miniature substrates. The assembly is heated under a substantial vacuum in order to facilitate the evolution of solvents and water vapor, and to minimize the size of any air pockets at the backs of miniature substrates 20–50. A plate with exhaust grooves formed on its surface may be placed on top of the substrates 20–50 to prevent air pockets or evolving gases from disturbing the positions of the substrates. The cured polyimide preferably has a coefficient of thermal expansion (CTE) which is close to that of the substrates 20–50 and base substrate 110. Polyimide which have CTEs close to that of silicon are commercially available from DuPont and Hitachi Chemicals.

As another attachment method, the fluidized polyimide precursor can be applied to the back surfaces of substrates 20–50, preferably in precisely sized drop at the center of each miniature substrate, and the substrates may then be pressed against base substrate 110. Each miniature substrate may be individually placed and pressed by a consistent force per unit area to minimize height differences between the miniature substrate. As another approach, the miniature substrates may be partially pressed individually, and then fully pressed into base substrate 110 as a group by a cushion pad mounted on a flat plate, preferably under a vacuum environment. This approach works well with shuttle-plate positioning method since the adhesive drops can be applied to all of the pre-positioned substrates in a short amount of time, since base substrate 110 can be mated against the shuttle plate in a short amount of time. In each approach, gaps 60 enable any excess material to squeeze out from under the substrate being attached. The fluidized precursor material is then soft-baked and cured under vacuum as above, preferably with a cover plate on top. These attachment methods provide better adhesion between the miniature substrates 20–50 and the base substrate 110 than obtained in those methods which partially soft-bake the precursor material. This is because the fluidized precursor has a lower viscosity and is able to make more contact points with the miniature substrates than the partially soft-baked layer.

Both of the general adhesion methods may be used together. Specifically, a thin polyimide precursor layer may be formed over base substrate and soft-baked to a tacky state, and a small drop of fluidized polyimide precursor may be applied to each of substrates 20–50 before it is attached.

Gap Filing Steps

Just as in the case of the adhesive, the gaps 60 between miniature substrates are to be filled with material which can withstand subsequent processing temperatures without decomposing or forming gaseous products in subsequent steps, and which can minimize the formation of gas bubbles. Polyimide materials can best meet these requirements, as indicated above. However, conventional polyimides can only be coated and soft-baked to a maximum thickness of about 20 μm to 40 μm at a time for reliable film formation. This makes it difficult to fill the gaps between miniature substrates since the gaps can have depths of 500 μm to 1,000 μm, or more. A 500 μm deep gap would have to be filled by 13 to 25 polyimide-layer formation steps, with each formation step involving a curing step. In addition, if the polyimide does not have a coefficient of thermal expansion which is close to that of the base substrate and the miniature substrates, the accumulation of several cured polyimide layers can place a large amount of tangential stress on the miniature substrates. Additionally, the cost of several processing steps would be high.

These problems can be addressed by using a combination of a thin, deposited polyimide layer and two or more screen-printed layers of a powder-filled polyimide composition. Stencil-printed layers may also be used. To form the thin polyimide layer, a layer of fluidized polyimide precursor is spin coated (or sprayed) to a thickness of between 10 μm and 25 μm (as measured after soft-bake), exposed to a vacuum to reduce the size and number of air bubbles that may be in or under the deposited layer, thereafter soft-baked to remove the solvent, and then cured to imidize the precursor. The polyimide precursor preferably has a low viscosity (corresponding to a high solvent content), which facilitates the reduction of air bubbles. This layer fills any air packets that may be at the bottom sides of the miniature substrates, and provides a smoother surface on the bottom walls of the gaps for the subsequent screen printing (or stencil printing) step. The composite substrate formed by base substrate 110 and miniature substrates 20–50 may be exposed to a vacuum during the soft-backing and curing steps to further reduce the number and size of any air bubbles. A self-priming polyimide precursor material is preferred. If the precursor material is a not self-priming, a layer of adhesion promoter is preferably deposited prior to depositing the fluidized precursor layer.

In the next step, the powder-filled polyimide precursor material is screen or stencil printed into the gaps. The screen or stencil has a pattern corresponding to the pattern of the gaps. The preferred goal of the first layer of powder-filled precursor material is to fill approximately 300 $\mu$m of the gap's depth. This may be accomplished by using a composition having 5 to 9 parts by volume of powder filler, 1 part by volume of polyimide precursor (e.g., polyamic acid), and a suitable amount of solvent for fluidization. This composition is screened or stenciled into gaps 60 to a level above the tops of the gaps as determined by the screen or stencil, and then allowed to settle (rest) for approximately ½ hour to an hour under vacuum and a modest elevated temperature (which decreases viscosity) to remove any air bubbles. The composite substrate is thereafter soft-baked, preferably under vacuum, to remove the solvent. The amount of solvent in the composition is selected so that the thickness of the screened layer shrinks to around 300 $\mu$m after soft-baking. The amount of solvent in the composition is generally between 4 parts and 7 parts by volume. Low-viscosity solvent and polyimide precursor are preferred. The powder filler preferably has a coefficient of thermal expansion (CTE) which is close to that of the base substrate 110 and the miniature substrates 20–50. The powder filler preferably comprises powdered silicon or powdered polyimide (low CTE of 3 ppm to 5 ppm) when the base substrate 110 and the miniature substrates 20–50 comprise silicon. The first powder-filled layer is cured to a relatively high temperature (compared to the curing of subsequent layers, and the composite substrate is briefly polished to remove excess material left on top of the miniature substrates by the first screening (or stenciling) operation.

One or more additional powder-filled layers are similarly formed and cured until the gaps are filled. These layers may be formed with powder-fill compositions which are more viscous than the first composition. Usually, only one or two additional powder-filled layers are needed for a 500 $\mu$m deep gap. FIG. 9 shows a filled gap 60 after two powder-filled layers have been formed and cured. The thin polyimide layer is shown at reference number 160, and the two powder-filled layers are shown at reference numbers 161 and 162. By screen-printing (or stencil printing) material into the gaps, the formation of a thick, uniform polymer layer over the entire surface of the composite substrate is avoided, and the stress caused by curing such a thick layer is therefore avoided. The body of material filling gaps 60 has a top surface which comes to within at least 50 $\mu$m of the top surface of lowest miniature substrate, and preferably closer.

Once the gaps are filled, the surface is polished, such as by chemical mechanical polishing, to remove excess material left on the tops of the miniature substrates, and to reduce differences in heights between the miniature substrates if the buffer layers and polish stop-layers substrates have been incorporated into the top layers of the miniature substrates, as described above. Then dielectric layers 112–116, metal lines 121–126 and 131–134, and chip interconnect pads are formed by conventional methods. Layer 112 is made relatively thick and then planarized to compensate for height differences among the miniature substrates that may remain. The via and interconnect methods described in U.S. patent application Ser. No. 08/717,266, to Beilin, et al., now U.S. Pat. No. 5,916,453, entitled "Methods of Planarizing Structures on Wafers and Substrates by Polishing," which is assigned to the assignee of the present application, may be used to form the metal lines, vias, and dielectric layers 113–116. Layers 112–116 preferably comprise polyimide, and the metal lines preferably comprises a multilayer composite of chromium/copper/chromium. The polyimide layers 113–116 are typically 10 $\mu$m to 15 $\mu$m in thickness. The copper layer is generally 2 $\mu$m to 5 $\mu$m in thickness and provides good electrical conductivity. The chromium layers are generally 200 A to 400 A in thickness and provide good adhesion between the copper and polyimide. Via apertures to miniature substrates 20–40 may be readily made by plasma etching or laser drilling. The via apertures may then be filled with conductive material by sputtering a thin chromium layer and then electroplating copper material through a photoresist mask.

The cured material in gaps 60 and in layer 111 will tend to evolve water vapor during the curing of polyimide layers 112–116. To minimize this amount of water vapor, layers 111, 160, and 161–162 maybe cured to a higher final temperature layers 112–116, for example to 380° C.–400° C. versus 350° C. for layers 112–116.

In one embodiment of the present invention, the power supply substrates 40 serve as polish-stop layers for the polishing of layer 112. For this purpose, the power supply substrates are made to be slightly higher than the highest tolerance level of substrates 20, 30, and 50, and may have portions of their metal traces coated with a polish-stop material, such as tungsten (W). In preferred embodiments, the power supply substrates are manufactured from a common substrate or wafer, which makes it relatively easy to manufacture the power supply substrates 40 with substantially the same height. The power bar layers formed on-a such a common substrate may be polished to a common plane, such as by mechanically polishing (MP) or chemical-mechanical polishing (CMP) before being coated with a polish-stop layer.

While the present invention has been particularly described with respect to the illustrated embodiments, it will be appreciated that various alterations, modifications and adaptations may be made based on the present disclosure, and are intended to be within the scope of the present invention. While the invention has been described in connection with what is presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A multilayer interconnect module for interconnecting a plurality of integrated circuit chips, said module comprising:
   a primary substrate having a top surface;
   a plurality of secondary substrates, each secondary substrate having a top surface, a bottom surface, and at least one side between its top and bottom surfaces, each said bottom surface being attached to the top surface of said primary substrate, at least one of said secondary substrates having a discrete capacitor formed on its top surface, each discrete capacitor having a first terminal and a second terminal disposed at the top surface of its corresponding secondary substrate;
   a plurality of gaps between the sides of said secondary substrates;
   a body of polymeric material formed in said gaps and having a top surface above the top surface of said primary substrate;
   a first dielectric layer formed over the top surfaces of said secondary substrates and said body of polymeric material;

a plurality of vias formed through said first dielectric layer, at least two vias being connected to corresponding terminals of one said discrete capacitor;

one or more additional dielectric layers formed over said first dielectric layer, each said additional dielectric layer having at least two vias formed therein;

a plurality of chip connection pads formed on the uppermost additional dielectric layer for interconnecting to the plurality of integrated circuit chips;

a first power supply line formed on at least one of said dielectric layers and connected to one of the terminals of one of said discrete capacitors through one of said vias formed through said first dielectric layer, said first power supply line further connected to one of said chip connection pads through at least one of said vias formed through one of said additional dielectric layers; and a second power supply line formed on at least one of said dielectric layers and connected to the other of the terminals of said one of the discrete capacitors through another one of said vias formed through said first dielectric layer, said second power supply line further connected to another one of said chip connection pads through at least one of said vias formed through one of said additional dielectric layers.

2. The module of claim 1 wherein one of said secondary substrates comprises a resistor formed on the top surface of the substrate and having a first terminal and a second terminal; and wherein said module further comprises a signal line formed on at least one of said dielectric layers and connected to the first terminal of said resistor through one of said vias formed through said first dielectric layer, said signal line further connected to one of said chip connection pads through at least one of said vias formed through one of said additional dielectric layers.

3. The module of claim 1 wherein one of said secondary substrates comprises a power supply substrate having a first supply strip formed on the top surface of the substrate; and wherein said first power supply line is further connected to said first power supply strip through one of said vias formed through said first dielectric layer.

4. The module of claim 3 wherein said power supply substrate further has a second power supply strip formed on the top surface of the substrate; and wherein said second power supply line is further connected to said second power supply strip through one of said vias formed through said first dielectric layer.

5. The module of claim 3 wherein one of said secondary substrates comprises a resistor formed on the top surface of the substrate and having a first terminal and a second terminal; and wherein said module further comprises a signal line formed on at least one of said dielectric layers and connected to the first terminal of said resistor through one of said vias formed through said first dielectric layer, said signal line further connected to one of said chip connection pads through at least one of said vias formed through one of said additional dielectric layers.

6. The module of claim 5 wherein said first power supply line is further connected to said second terminal of said resistor through one of said vias formed through said first dielectric layer.

7. The module of claim 1 wherein a plurality of integrated circuit chips are mounted on said chip connection pads with their top surfaces facing the top surfaces of said secondary substrates.

8. The module of claim 1 wherein each secondary substrate has been tested prior to assembly of the module.

9. The module of claim 1 wherein the top surface of said body of polymeric material is within 50 $\mu$m of the top surface of at least one secondary substrate.

10. The module of claim 1 wherein said body of polymeric material comprises a polyimide filler material.

11. The module of claim 1 wherein said first dielectric layer is formed from a fluidized polyimide precursor which is deposited over the top surfaces of said secondary substrates and said body of polymeric material.

12. The module of claim 1 wherein each said additional dielectric layers is formed from a fluidized polyimide precursor and has a thickness of less than 20 $\mu$m.

13. The module of claim 1 wherein said secondary substrates are attached to said primary substrate by a polyimide layer formed over the top surface of said primary substrate.

14. A multilayer interconnect module for interconnecting a plurality of integrated circuit chips, said module comprising:

a primary substrate having a top surface;

a plurality of secondary substrates, each secondary substrate having a top surface, a bottom surface, and at least one side between its top and bottom surfaces, each said bottom surface being attached to the top surface of said primary substrate, at least one of said secondary substrates having at least one discrete resistor formed on its top surface, each discrete resistor having a first terminal and a second terminal disposed at the top surface of its corresponding secondary substrate;

a plurality of gaps between the sides of said secondary substrates;

a body of polymeric material formed in said gaps and having a top surface above the top surface of said primary substrate;

a first dielectric layer formed over the top surfaces of said secondary substrates and said body of polymeric material;

a plurality of vias formed through said first dielectric layer, at least two vias being connected to corresponding terminals of one said discrete resistor;

one or more additional dielectric layers formed over said first dielectric layer, each said additional dielectric layer having at least two vias formed therein;

a plurality of chip connection pads formed on the uppermost additional dielectric layer for interconnecting to the plurality of integrated circuit chips;

a signal line formed on at least one of said dielectric layers and connected to the first terminal of a first one of said discrete resistors through one of said vias formed through said first dielectric layer, said signal line further connected to one of said chip connection pads through at least one of said vias formed through one of said additional dielectric layers; and a first power supply line formed on at least one of said dielectric layers and connected to the second terminal of said first discrete resistor through one of said vias formed through said first dielectric layer, said first power supply line further connected to one of said chip connection pads through at least one of said vias formed through one of said additional dielectric layers.

15. The module of claim 14 wherein one of said secondary substrates comprises a power supply substrate having a first supply strip formed on the top surface of the substrate; and wherein said first power supply line is further connected to said first power supply strip through one of said vias formed through said first dielectric layer.

16. The module of claim 14 wherein a plurality of integrated circuit chips are mounted on said chip connection pads with their top surfaces facing the top surfaces of said secondary substrates.

17. The module of claim 14 wherein each secondary substrate has been tested prior to assembly of the module.

18. The module of claim 14 wherein the top surface of said body of polymeric material is within 50 μm of the top surface of at least one secondary substrate.

19. The module of claim 14 wherein said body of polymeric material comprises a polyimide filler material.

20. The module of claim 14 wherein said first dielectric layer is formed from a fluidized polyimide precursor which is deposited over the top surfaces of said secondary substrates and said body of polymeric material.

21. The module of claim 14 wherein each said additional dielectric layers is formed from a fluidized polyimide precursor and has a thickness of less than 20 μm.

22. The module of claim 14 wherein said secondary substrates are attached to said primary substrate by a polyimide layer formed over the top surface of said primary substrate.

* * * * *